United States Patent
Franco

(12) 
(10) Patent No.: US 6,221,719 B1
(45) Date of Patent: Apr. 24, 2001

(54) PROCESS FOR THE MANUFACTURING OF A DMOS-TECHNOLOGY TRANSISTOR PROVIDING FOR A SINGLE THERMAL PROCESS FOR THE FORMATION OF SOURCE AND BODY REGIONS

(75) Inventor: Giovanni Franco, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/119,853

(22) Filed: Jul. 21, 1998

(30) Foreign Application Priority Data

Jul. 21, 1997 (EP) .................................. 97830371

(51) Int. Cl.$^7$ .......................... H01L 21/336; H01L 21/28
(52) U.S. Cl. ........................... 438/268; 438/272; 438/526
(58) Field of Search .................................. 438/268, 272, 438/576

(56) References Cited

U.S. PATENT DOCUMENTS

| | | | |
|---|---|---|---|
| 4,040,878 | * 8/1977 | Rowe | 148/188 |
| 4,119,993 | * 10/1978 | Hartnagel et al. | 357/23 |
| 4,804,634 | * 2/1989 | Krishna | 437/32 |
| 5,141,894 | * 8/1992 | Bisaro et al. | 437/132 |
| 5,262,336 | 11/1993 | Pike, Jr. et al. | 437/31 |

FOREIGN PATENT DOCUMENTS 0 416 805 3/1991 (EP) .............................. H01L/29/06

OTHER PUBLICATIONS

European Search Report from European Patent Application 97830371.7. filed Jul. 21, 1997.

* cited by examiner

Primary Examiner—Andrew Tran
Assistant Examiner—Michael S. Lebentritt
(74) Attorney, Agent, or Firm—Wolf, Greenfield & Sacks, P.C.; James H. Morris; Theodore E. Galanthay

(57) ABSTRACT

Process for the manufacturing of a DMOS-technology transistor, providing for forming, over a semiconductor material layer of a first conductivity type, an insulated gate electrode, introducing in said semiconductor material layer a first dopant of a second conductivity type for forming at least one body region of a second conductivity type extending under the insulated gate electrode, and introducing in said at least one body region a second dopant of the first conductivity type for forming, inside said body region, at least one source region of the first conductivity type, said body region and said source region defining, under the insulated gate electrode, a channel region for the DMOS transistor, wherein said first dopant is aluminum. After the introduction of said first dopant and said second dopant, a single thermal diffusion process for simultaneously diffusing the first dopant and the second dopant is provided.

17 Claims, 4 Drawing Sheets

PROCESS FOR THE MANUFACTURING OF A DMOS-TECHNOLOGY TRANSISTOR PROVIDING FOR A SINGLE THERMAL PROCESS FOR THE FORMATION OF SOURCE AND BODY REGIONS

BACKGROUND OF THE INVENTION

1. Field of the Invention

The present invention relates to a process for the manufacturing of a DMOS-technology transistor, particularly a power or non-power DMOS transistor such as a power MOSFET, an IGBT or an MCT, providing for a single thermal process for the formation of source and body regions.

2. Discussion of the Related Art

Conventionally, in DMOS (Double-diffused MOS) transistors the channel region is obtained by exploiting the different diffusivity of the two dopant species used to form the body regions and the source regions, each of which regions is formed by means of different thermal processes.

By way of example, a process for the manufacturing of an N-channel DMOS transistor generally starts from an N+ substrate, over which an N type layer is epitaxially grown. A gate oxide layer is then formed over the N type epitaxial layer, and a polysilicon layer is formed over the gate oxide layer. Gate electrodes are then formed by means of masking and selective etching of the polysilicon and gate oxide layers.

By means of the same mask used to define the gate electrodes, a P type dopant is then implanted, and a subsequent thermal process is performed for diffusing the dopant so as to form the body regions.

In particular, boron is used as the P type dopant for the body regions; as known, boron has a diffusivity sufficiently high to make the body regions diffuse adequately under the respective polysilicon gate electrodes. The diffusion of the body region under the gate electrode define the device's channel length.

A masking is then optionally performed for defining the source regions, and an N type dopant is implanted. The N type dopant is then made to diffuse by means of a subsequent thermal process, so as to form source regions inside the body regions.

N type dopants normally employed are arsenic, phosphorus or antimony, all of which have diffusivities lower than that of boron.

The difference in the diffusivities of the dopants used to form the body regions and the source regions allows forming channel regions of the DMOS transistor under the gate electrodes.

A drawback of the process described, that provides for performing two distinct thermal diffusion processes for the formation of the body regions and the source regions, is the long time needed to form the these regions.

In fact, rapid temperature changes can cause substantial thermal stresses of the silicon wafers, stresses that are greater as the diameter of the wafers increases. Such thermal stresses can cause an increase of the number of defects in the components integrated on the chips of a silicon wafer. Thus, the steady-state temperature of the diffusion processes must be reached quite smoothly.

Similarly, at the end of the thermal process the temperature must be lowered quite slowly. Typically, the steady-state temperature to be reached for thermally diffusing the above mentioned dopants ranges from 1000 and 1150° C., and the diffusion times varies from 1 to 10 hours. This times, already quite long, must thus be added with the time necessary for gradually rising and lowering the temperature of the wafers.

Additionally, it is known that when the thermal diffusion processes are performed in ovens, in order to have stable and reproducible thermal diffusion processes the diffusion times cannot be too short. Thus, it is not possible to excessively reduce that part if the thermal process performed at the steady-state temperature.

For all these reasons, it is not possible to decrease the size of the devices so as to achieve a higher cell integration density without impacting the device performance.

These constraints impose a lower limit to the time necessary for the manufacturing of the devices.

Another drawback inherent to the formation of the body regions and the source regions by means of two distinct thermal processes is the photolithographic misalignment, that makes the channel length difficult to be controlled.

SUMMARY OF THE INVENTION

In view of the state of the art, a first object of the present invention is that of providing a manufacturing process allowing for improving the fine adjustment of the channel region.

A second object is that of providing a process allowing for lower temperatures to be used (approximately 800–1100° C.).

A third object is that of providing a process allowing for reducing the manufacturing time.

According to the present invention, these and other objects are achieved by means of a process for the manufacturing of a DMOS-technology transistor, providing for forming, over a semiconductor material layer of a first conductivity type, an insulated gate electrode, introducing in said semiconductor material layer a first dopant of a second conductivity type for forming at least one body region of a second conductivity type extending under the insulated gate electrode, and introducing in said at least one body region a second dopant of the first conductivity type for forming, inside said body region, at least one source region of the first conductivity type, said body region and said source region defining under the insulated gate electrode, a channel region for the DMOS transistor, wherein said first dopant is aluminum, and the process provides, after the introduction of said first dopant and said second dopant, a single thermal diffusion process for simultaneously diffusing the first dopant and the second dopant.

As a result of the present invention, there is provided a process for the manufacturing of a DMOS-technology transistor providing for a single thermal process for the formation of the source and body.

This is made possible thanks to the use of aluminum as a P-type dopant for the formation of the body.

It has in fact experimentally verified that aluminum has a perfect compatibility with the N-type dopant species used for the formation of the source (typically arsenic, phosphorus, antimony), because the diffusivity of aluminum is not affected by the presence of such dopant species. Avoiding one thermal process, it is thus possible to reduce the manufacturing time of the devices, and the devices' dimension can also be reduced to increase the integration scale.

BRIEF DESCRIPTION OF THE DRAWINGS

The features and advantages of the present invention will be made more apparent by the following detailed description of a particular embodiment thereof, described as non-limiting example in the annexed drawings, wherein.

DETAILED DESCRIPTION

Figure 1:
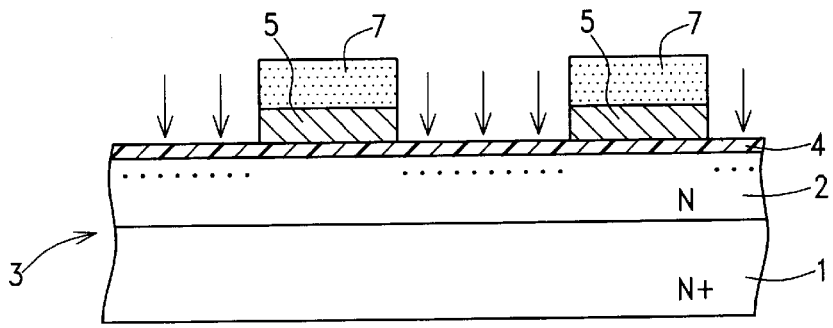
FIGS. 1 to 4 show in cross-section steps of a process according to the invention for the manufacturing of a DMOS transistor.

With reference to FIGS. 1 to 4, a process according to the present invention for the manufacturing of a DMOS transistor provides for epitaxially growing, over a heavily doped silicon layer 1 e.g. of the N type, of a lightly-doped N-type layer 2. These two layers form a drain region 3.

A gate oxide layer 4 is formed over a surface of the drain region 3, typically by means of thermal oxidation. Over the gate oxide layer 4 a polysilicon layer 5 is formed constituting the insulated gate electrode of the DMOS transistor.

After having deposited over the polysilicon layer 5 a photoresist layer 7, by means of a photolithographic technique involving the use of a first mask layers 5 and 7 are selectively removed for defining the gate electrode and opening windows for the formation of body regions 6. Then, using the polysilicon layer 5 and the photoresist layer 7 as a mask and through the windows previously opened, P-type body regions 6 are formed. In particular, according to the invention aluminum atoms are implanted in a dose ranging from $1*10^{13}$ to $5*10^{14}$ atoms/cm$^2$ and an implantation energy ranging from 60 keV to 1 MeV.

Figure 2:
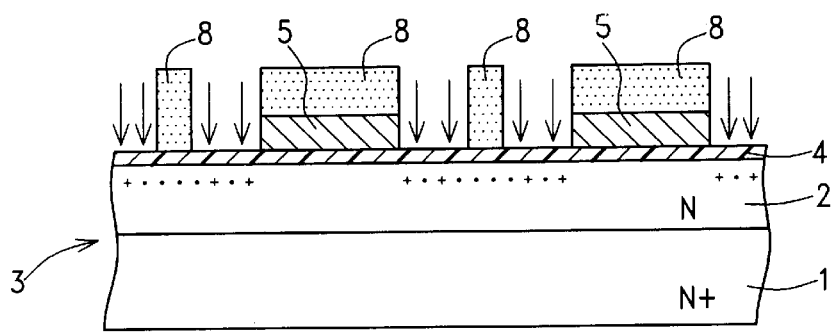

After having removed the photoresist layer 7 and having deposited another photoresist layer 8, using again a photolithographic technique involving the use of a second mask, the photoresist layer 8 is selectively removed to open windows for the formation of source regions 9. Through the windows thus opened, N type source regions 9 are formed. In particular, arsenic, phosphorus or antimony atoms are implanted in a dose ranging from $1*10^{14}$ to $5*10^{15}$ atoms/cm$^2$ and at an implant energy ranging from 80 keV to 1 MeV (FIG. 2).

Then, a single thermal diffusion process is performed, so that the implanted aluminum atoms diffuse both in the vertical and in the lateral directions under the gate electrode 5, thus defining the channel of the device.

Figure 3:
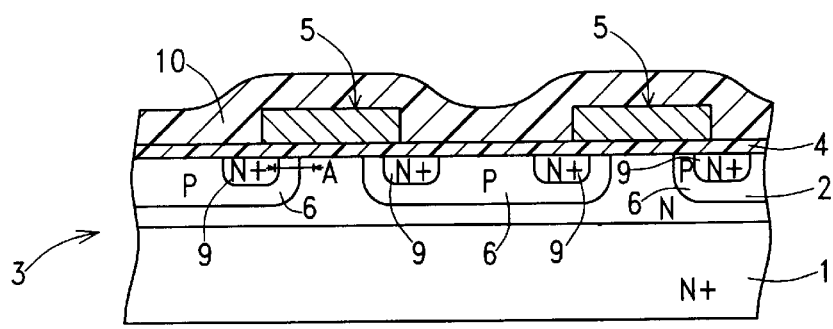

Simultaneously, also the N type dopant diffuses vertically and laterally under the gate electrode 5 to guarantee that the channel region is formed completely under the gate electrode 5 (FIG. 3).

In the case of processes performed in an oven, the temperature to be reached for performing the thermal diffusion process is preferably in the range 800–1100° C., for a time equal or greater than 15 minutes.

It is also possible to use thermal diffusion processes in Rapid Thermal Annealers (RTAs), and in such a case the temperature to be reached can be comprised between 850 and 1200° C., for a time ranging from some seconds to a few minutes.

In the process according to the invention, aluminum is used for the formation of the body regions, because it has been experimentally verified that aluminum has a perfect compatibility with the N-type dopant species normally used to form the source regions. By "perfect compatibility" it is meant the fact that the diffusivity of aluminum atoms is not affected by the presence of the N-type dopant species. Thanks to this, it is possible to perform a unique thermal diffusion process for the simultaneous formation of the body regions and the source regions, even assuring the fine adjustment of length of the channel region, that as known is given by the difference in the lateral diffusion under the gate electrode of the P-type dopant and the N-type dopant This is not possible using conventional manufacturing processes, that typically provide for using boron as a P-type dopant for the formation of the body regions. Boron is normally preferred due to its high diffusivity. In this case however the N-type dopants used for the formation of the source regions, e.g. arsenic and antimony completely prevent the diffusion of boron, preventing the channel formation.

If instead phosphorus is used for forming the source regions, the diffusivity of boron used for the body regions increases due to the presence of phosphorus, causing the formation of uncontrolled junctions.

Therefore, in both cases it is not possible to exploit a unique thermal diffusion process for the formation of the body regions and the source regions, because it would not be possible to control the length of the channel region.

The manufacturing process then provides for conventionally depositing a dielectric layer 10 over the whole surface of the device (FIG. 3).

Figure 4:
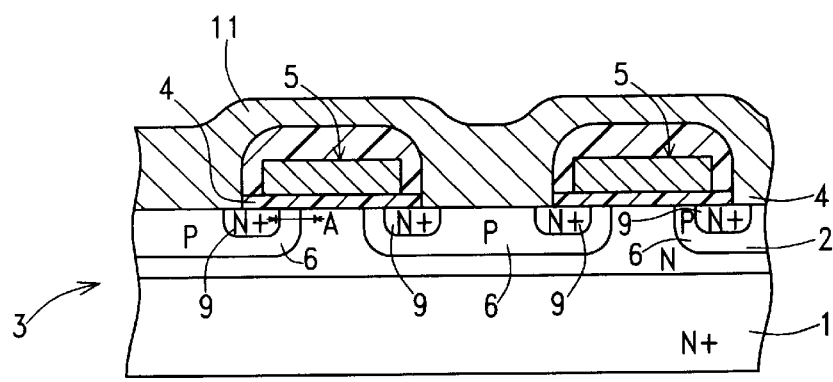

The dielectric layer 10 and the oxide layer 4 are then selectively removed, so that the source regions 9 and a portion of the body regions 6 can be contacted and short-circuited together by a source metal layer 11 (FIG. 4).

As known, it would also be possible to form the dielectric layer before defining the gate electrode, and then providing the formation of insulating spacers at the sides of the gate.

Figure 5:
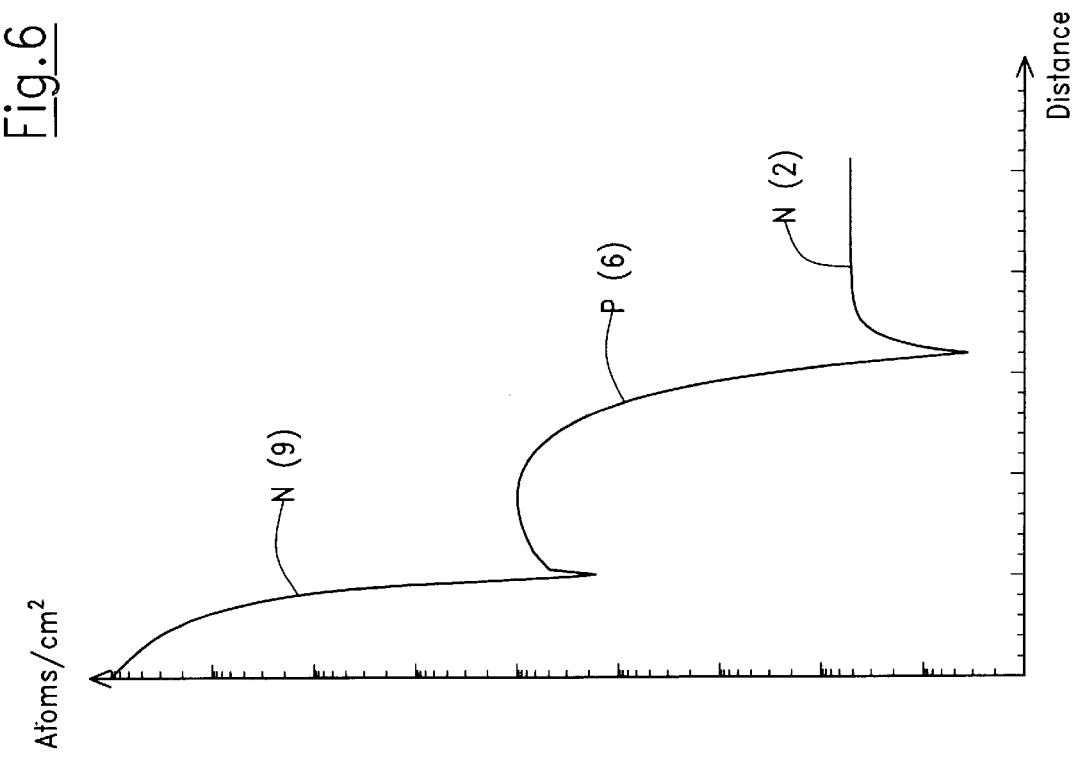
FIG. 5 shows a surface doping profile along line A—A in FIG. 3 of a medium-voltage DMOS device fabricated according to the prior art.
Figure 6:
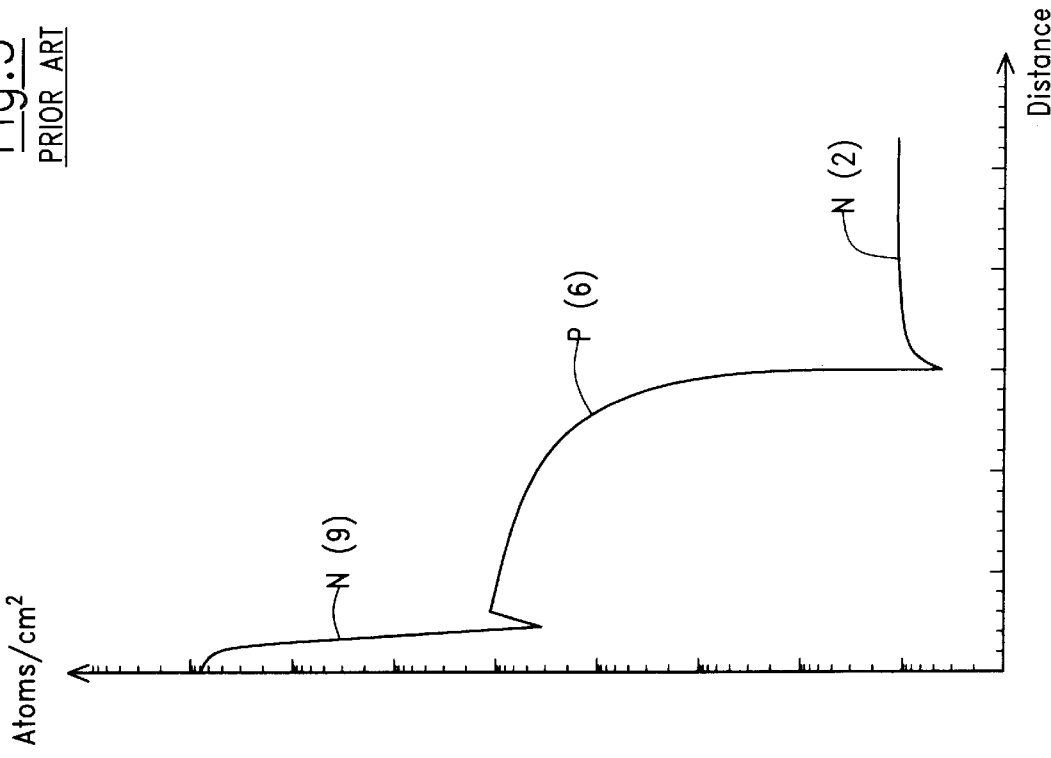
FIG. 6 shows a surface doping profile along line A—A of FIG. 3 of a similar medium-voltage DMOS device fabricated by means of the process according to the invention.
Figure 7:
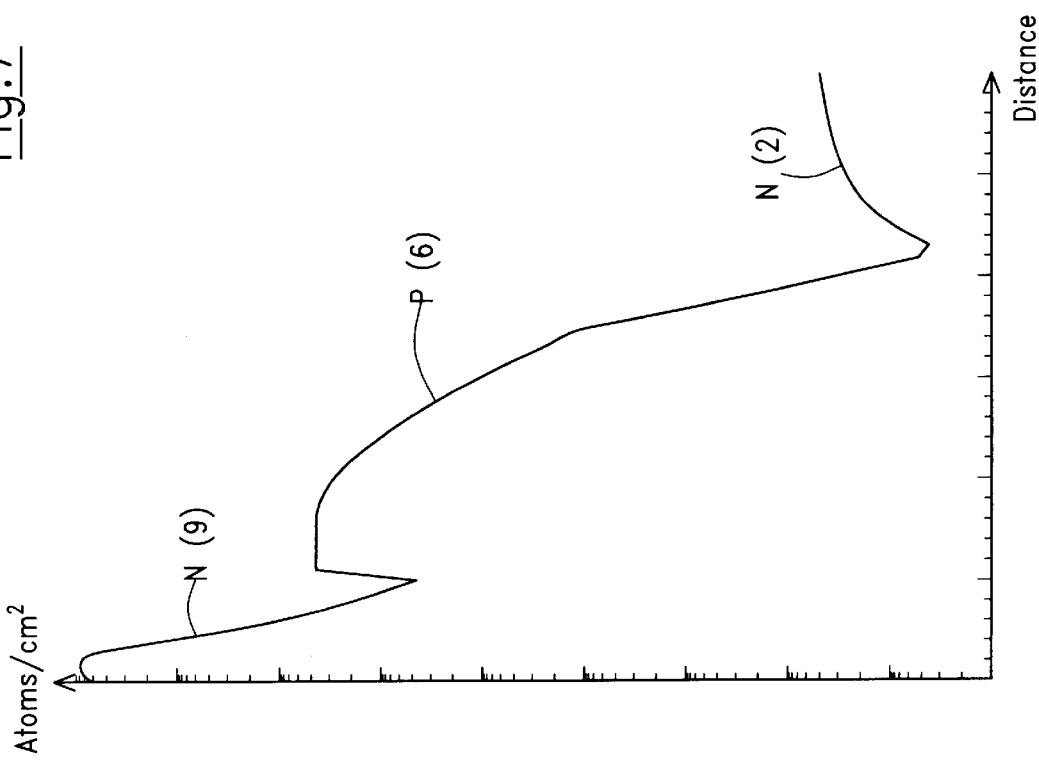
FIG. 7 shows a surface doping profile along line A—A in FIG. 3 of a low-voltage DMOS device fabricated by means of the process according to the invention.
Figure 8:
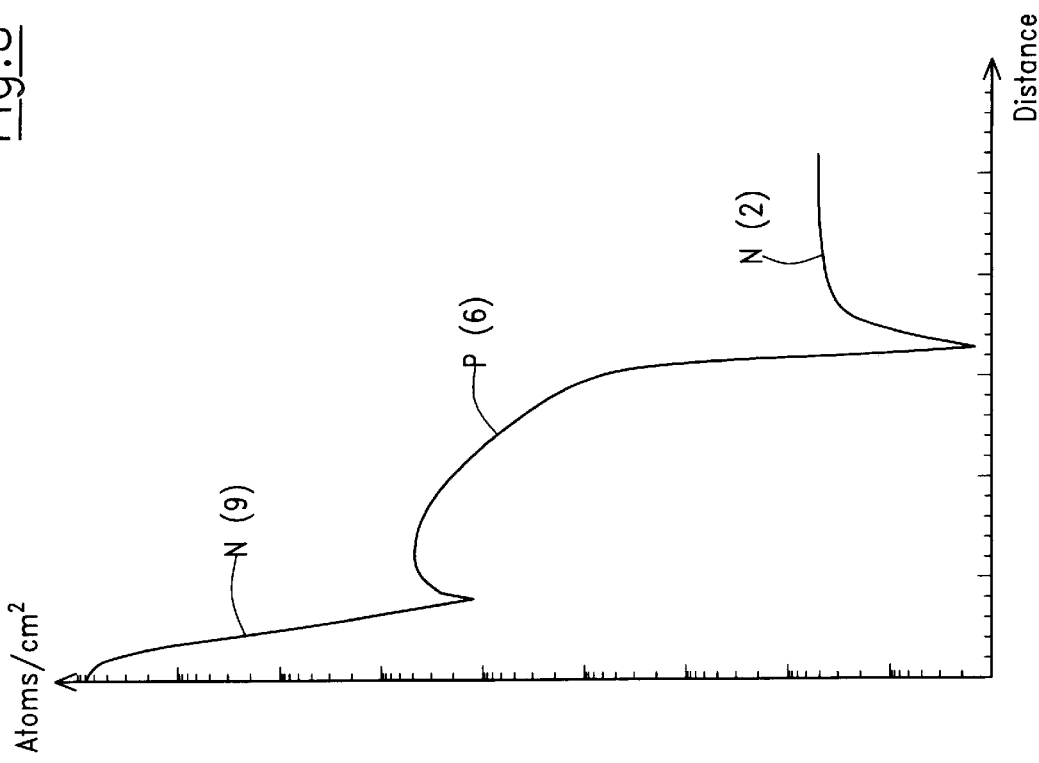
FIG. 8 shows a surface doping profile along line A—A in FIG. 3 of a high-voltage DMOS device fabricated by means of the process according to the invention.

FIG. 5 shows the doping concentration profiles of a medium-voltage DMOS device fabricated according to the prior art, taken along line A—A in FIG. 3. The doping concentration profiles of the source region, the channel region and the drain region are shown. FIGS. 6 to 8 show instead the doping concentration profiles, along line A—A in FIG. 3, of a low-voltage, a medium-voltage and a high-voltage DMOS devices, respectively, all fabricated by means of the process according to the invention.

Comparing the doping profiles of a medium-voltage DMOS device fabricated according to the prior art (FIG. 5) and a similar device fabricated by means of the process according to the invention (FIG. 6), it can be noted that the latter has substantially the same physical and technological parameters (channel length, same doping concentration in the source, channel and drain regions).

The process of the invention allows for fabricating devices having the same physical and technological characteristics as the devices fabricated by means of processes requiring two thermal processes for forming the various regions of the transistors.

Additionally, using aluminum as a P-type dopant for forming the body regions and performing a unique thermal diffusion process for forming both the body regions and the source regions, no additional layers such as ONO, SIPOS, polysilicon are required for preventing aluminum from evaporating from the surface.

The process according to the invention has been described so far making reference to a DMOS transistor, however it also applies to the fabrication of an IGBT or an MCT, both with polygonal elementary cells and a stripe layout.

Figure 9:
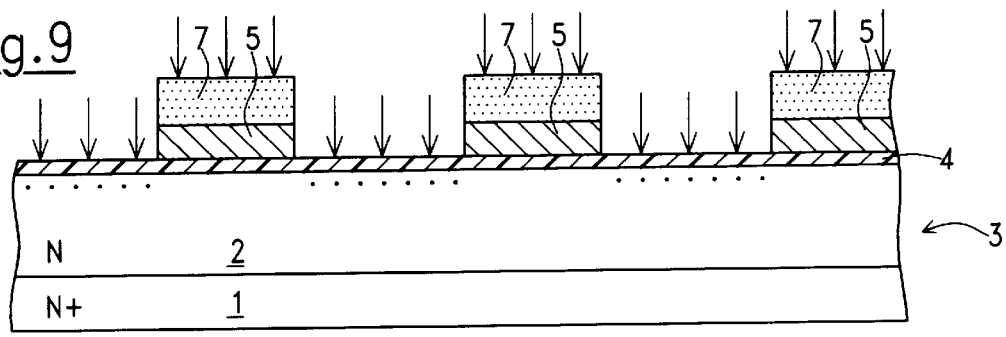
FIGS. 9 to 11 show in cross-section the steps of a process according to the invention for the manufacturing of a DMOS transistor having a stripe layout.
Figure 10:
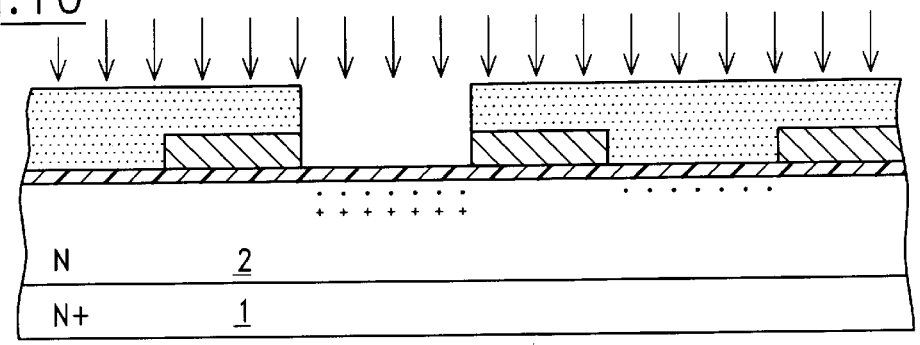
Figure 11:
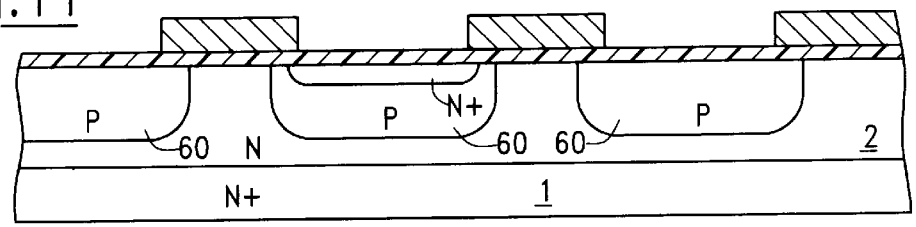
Figure 12:
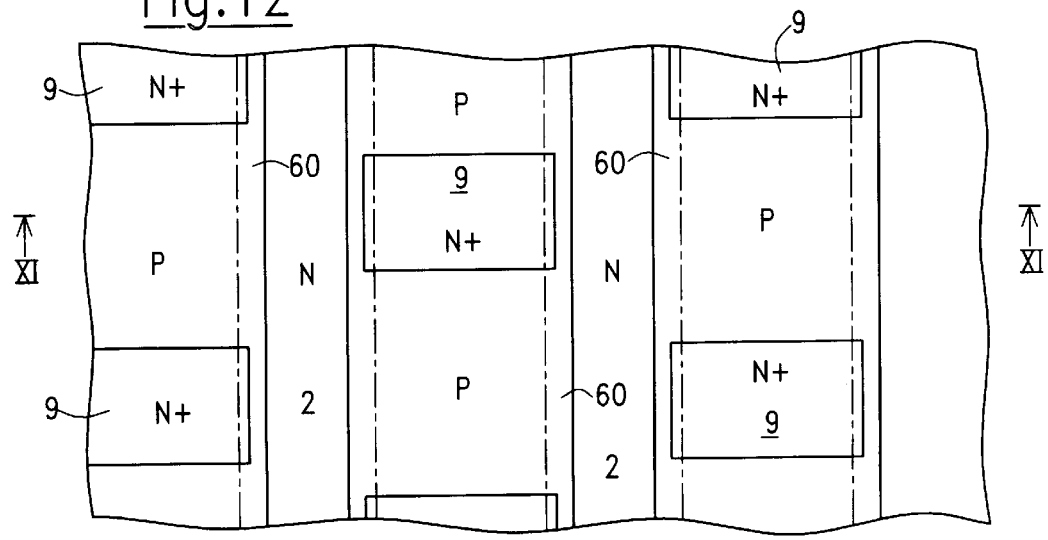
FIG. 12 is a top-plan view, at the level of the silicon surface, of the stripe-layout DMOS transistor fabricated by means of the process according to the invention.

By way of example, FIGS. 9 to 11 show in cross-section the main steps of a process according to the invention for the fabrication of a DMOS having a stripe layout. In FIG. 9, similarly to FIG. 3, after having defined in the polysilicon layer 5 elongated openings suitable to define gate stripes, aluminum is implanted that will define elongated P-type body stripes 60. Then, by means of another mask, arsenic, phosphorus or antimony is implanted, that will define the source regions (FIG. 10). Advantageously, as shown in FIG. 12, the source regions 9 formed inside the body stripes 60 are intercalated, so that a given source region inside a stripe does not face source regions inside adjacent stripes. Then, a unique thermal diffusion process is performed for the simultaneous diffusion of aluminum and arsenic, phosphorus or antimony, and the simultaneous formation of both the body stripes and the source regions inside the former (FIG. 11).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process for manufacturing of a DMOS-technology transistor, providing for forming, over a semiconductor material layer of a first conductivity type, an insulated gate electrode, introducing in said semiconductor material layer a first dopant of a second conductivity type for forming at least one body region of a second conductivity type extending under the insulated gate electrode, and introducing in said at least one body region a second dopant of the first conductivity type for forming, inside said body region, at least one source region of the first conductivity type, said body region and said source region defining, under the insulated gate electrode, a channel region for the DMOS transistor, wherein said first dopant is aluminum, and in that the process provides, after the introduction of said first dopant and said second dopant, a single thermal diffusion process for simultaneously diffusing the first dopant and the second dopant.

2. Process according to claim 1, wherein said second dopant is a dopant chosen from the group comprising phosphorus, antimony, arsenic.

3. Process according to claim 2, wherein said first dopant is introduced by means of ion implantation in a dose ranging from $1*10^{13}$ to $5*10^{14}$ atoms/cm$^2$ and with an implantation energy ranging from 60 keV to 1 MeV.

4. Process according to claim 3, wherein said second dopant is introduced by means of ion implantation in a dose ranging from $1*10^{14}$ to $5*10^{15}$ atoms/cm$^2$ with an implantation energy ranging from 80 keV to 1 MeV.

5. Process according to claim 1, wherein said single thermal diffusion process is performed in an oven at a temperature ranging from 800 to 1100° C. for a time equal or greater than approximately 15 minutes.

6. Process according to claim 1, wherein said single thermal diffusion process is performed in a Rapid Thermal Annealer (RTA) at a temperature ranging from 850 to 1200° C. and for a time ranging from some seconds to a few minutes.

7. Process according to claim 1, wherein said first dopant is introduced by means of ion implantation in a dose ranging from $1*10^{13}$ to $5*10^{14}$ atoms/cm$^2$.

8. Process according to claim 7, wherein said first dopant is introduced with an implantation energy ranging from 60 keV to 1 MeV.

9. Process according to claim 1, wherein said second dopant is introduced by means of ion implantation in a dose ranging from $1*10^{14}$ to $5*10^{15}$ atoms/cm$^2$.

10. Process according to claim 9, wherein said second dopant is introduced with an implantation energy ranging from 80 keV to 1 MeV.

11. Process according to claim 1, wherein said single thermal diffusion process is performed in an oven at a temperature ranging from 800 to 1100° C.

12. Process according to claim 1, wherein said single thermal diffusion process is performed for a time equal or greater than approximately 15 minutes.

13. Process according to claim 1, wherein said single thermal diffusion process is performed in a Rapid Thermal Annealer (RTA) at a temperature ranging from 850 to 1200° C.

14. Process according to claim 1, wherein said single thermal diffusion process is performed for a time ranging from some seconds to a few minutes.

15. Process according to claim 1, further including depositing a dielectric layer.

16. Process according to claim 15, wherein the dielectric layer is selectively removed so that the source region and the body region can be contacted.

17. Process according to claim 16, providing a metal layer over the dielectric layer.

* * * * *